(12) United States Patent
Pan (10) Patent No.: US 12,237,222 B2
(45) Date of Patent: Feb. 25, 2025

(54) METHOD FOR MANUFACTURING SEMICONDUCTOR DEVICE AND SAME

(71) Applicant: CHANGXIN MEMORY TECHNOLOGIES, INC., Hefei (CN)

(72) Inventor: Fan Pan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 358 days.

(21) Appl. No.: 17/866,688

(22) Filed: Jul. 18, 2022

(65) Prior Publication Data

US 2023/0134285 A1    May 4, 2023

Related U.S. Application Data

(63) Continuation of application No. PCT/CN2021/136489, filed on Dec. 8, 2021.

(30) Foreign Application Priority Data

Oct. 28, 2021  (CN) .......................... 202111266168.3

(51) Int. Cl.
| | | |
|---|---|---|
| H01L 21/768 | (2006.01) | |
| H01L 23/528 | (2006.01) | |
| H01L 23/532 | (2006.01) | |
| H10B 12/00 | (2023.01) | |

(52) U.S. Cl.
CPC .. *H01L 21/76883* (2013.01); *H01L 21/76898* (2013.01); *H01L 23/5283* (2013.01); *H01L 23/53271* (2013.01); *H10B 12/482* (2023.02); *H10B 12/485* (2023.02); *H10B 12/488* (2023.02)

(58) Field of Classification Search
CPC ......... H01L 21/76883; H01L 21/76898; H01L 23/5283; H01L 23/53271; H01L 21/02667; H01L 21/02381; H01L 21/0243; H01L 21/0245; H01L 21/02488; H01L 21/02502; H01L 21/02513; H01L 21/02576; H01L 21/02579; H01L 21/0262; H01L 21/76831; H01L 21/76877; H01L 21/02595;
(Continued)

(56) References Cited

U.S. PATENT DOCUMENTS

| | | | | |
|---|---|---|---|---|
| 11,742,208 | B2 * | 8/2023 | Gilmore | .............. H01L 29/4236 257/741 |
| 2008/0076231 | A1 * | 3/2008 | Shin | ........................ H01L 28/84 257/E21.135 |

(Continued)

FOREIGN PATENT DOCUMENTS

| | | | | |
|---|---|---|---|---|
| CN | 103035500 A | | 4/2013 | |
| CN | 103377907 A | * | 10/2013 | ............. H10B 12/03 |

(Continued)

*Primary Examiner* — Kyoung Lee
*Assistant Examiner* — Sophia W Kao
(74) *Attorney, Agent, or Firm* — Syncoda LLC; Feng Ma (57) ABSTRACT

Embodiments of the disclosure provide a method for manufacturing a semiconductor device. The method includes: providing a substrate having at least one trench; forming a first polysilicon layer in the trench, covering a sidewall and a bottom of the trench and not fully fills the trench; annealing the first polysilicon layer; and forming a second polysilicon layer at a region of the trench where the first polysilicon layer is not filled after annealing.

13 Claims, 8 Drawing Sheets

(58) Field of Classification Search
CPC ............ H01L 21/02532; H10B 12/482; H10B 12/485; H10B 12/488
See application file for complete search history.

(56) References Cited

U.S. PATENT DOCUMENTS

| | | | |
|---|---|---|---|
| 2010/0052048 A1* | 3/2010 | Kang ................ | H01L 29/66621 257/330 |
| 2016/0149011 A1* | 5/2016 | Hu ..................... | H01L 21/2253 257/741 |
| 2016/0172235 A1 | 6/2016 | Srinivasan et al. | |
| 2023/0106397 A1* | 4/2023 | Nogami ............ | H01L 21/76898 257/774 |

FOREIGN PATENT DOCUMENTS

| | | | |
|---|---|---|---|
| CN | 105702716 A | | 6/2016 |
| CN | 110931432 A | | 3/2020 |
| KR | 100908823 B1 | * | 7/2009 |
| KR | 20100028362 A | | 3/2010 |

\* cited by examiner

METHOD FOR MANUFACTURING SEMICONDUCTOR DEVICE AND SAME

CROSS-REFERENCE OF RELATED APPLICATIONS

This application is a continuation of International Application No. PCT/CN2021/136489, filed on Dec. 8, 2021, which claims priority to Chinese Patent Application No. 202111266168.3, filed on Oct. 28, 2021. The disclosures of International Application No. PCT/CN2021/136489 and Chinese Patent Application No. 202111266168.3 are hereby incorporated by reference in their entireties.

BACKGROUND

Semiconductor devices, such as dynamic random access memory (DRAM), include many conductive lines, which usually need to fill polysilicon layers in trenches when they are formed.

However, due to the limitation of process conditions or because the aspect ratio of the trenches is too large, relatively large voids are prone to exist in the polysilicon layers that are filled in the trenches, thus affects the electrical properties of the conductive lines.

SUMMARY

The disclosure relates to the technical field of semiconductor manufacturing, in particular to a method for manufacturing a semiconductor device and a semiconductor device.

Embodiments of the present disclosure provide a method for manufacturing a semiconductor device. The method includes: providing a substrate having at least one trench; forming a first polysilicon layer in the trench, covering a sidewall and a bottom of the trench and not fully fills the trench; annealing the first polysilicon layer; and forming a second polysilicon layer at a region of the trench where the first polysilicon layer is not filled after annealing.

Embodiments of the present disclosure further provide a semiconductor device. The semiconductor device includes: a substrate, having at least one trench; a first polysilicon layer, covering a sidewall and a bottom of the trench, and a second opening being provided above the first polysilicon layer, which has a cross-sectional shape of a wide top and a narrow bottom; and a second polysilicon layer, located in the second opening.

The details of one or more embodiments of the disclosure are set forth in the accompanying drawings and the description below. Other features and advantages of the disclosure will be apparent from the description, the drawings, and claims.

BRIEF DESCRIPTION OF THE DRAWINGS

In order to more clearly illustrate the technical solutions of the embodiments of the disclosure, a brief description of the accompanying drawings used in the embodiments will be provided below. Apparently, the drawings of the following description are merely some embodiments of the disclosure. For a person of ordinary skill in the art, other drawings can be obtained based on these drawings without creative work.

DETAILED DESCRIPTION

Exemplary embodiments of the present disclosure will be described in more detail below with reference to the accompanying drawings. Although exemplary embodiments of the present disclosure are shown in the drawings, it should be understood that the present disclosure may be implemented in various forms and should not be limited to the specific embodiments set forth herein. These embodiments are provided for the purpose that the disclosure will be more thoroughly understood and the scope of the disclosure will be fully conveyed to those skilled in the art.

In the description below, numerous specific details are given for thorough understanding of the disclosure. However it will be apparent to those skilled in the art that the disclosure may be implemented without one or more of these details. In other examples, some technical features well-known in the art are not described in order to avoid confusion with the present disclosure; that is, not all of the features of actual embodiments are described herein, and well-known functions and structures are not described in detail.

In the drawings, the dimensions of layers, regions, elements and their relative dimensions may be exaggerated for clarity. The same reference numeral denotes the same element throughout the text.

It should be understood that when an element or a layer is referred to as "on", "adjacent to", "connected to" or "coupled to" another element or layer, it may be directly on the other element or layer, adjacent to the other element or layer, or connected to or coupled to the other element or layer, or there may be an intermediate element or layer therebetween. In contrast, when an element is described as "directly on", "directly adjacent to", "directly connected to" or "directly coupled to" another element or layer, there is no intermediate element or layer therebetween. It should be understood that although the terms, "first", "second", "third" and the like may be used to describe various elements, components, regions, layers, and/or portions, these elements, parts, regions, layers, and/or portions should not be limited by these terms. These terms are only used to distinguish one element, part, region, layer or portion from another element, part, region, layer or portion. Therefore, without departing from the teaching of the present disclosure, a first element, part, region, layer or portion discussed hereinafter may be expressed as a second element, part, region, layer or portion. While discussing a second element, part, region, layer or portion, it does not imply that a first element, part, region, layer or portion is necessarily present in the present disclosure.

Spatial relationship terms such as "beneath", "below", "lower", "under", "above", or "upper" may be used herein for convenience to describe a relationship between one element or feature and another element or feature shown in the drawings. It should be understood, the spatial relationship terms tend to further include different orientations of a device in use and operation in addition to the orientations shown in the drawings. For example, if the device in the drawings is turned over, an element or feature described as being "below" or "under" or "beneath" another element will be oriented as being "above" the other element or feature. Therefore, the exemplary terms "below" and "under" may include up and down orientations. The device may also include additional orientations (e.g., rotation for 90 degrees or other orientations), and the spatial terms used herein are interpreted accordingly.

The terms used herein are intended to describe specific embodiments only and are not to be a limitation to the present disclosure. As used herein, the singular forms "a/an", "one", and "the/said" are intended to include the plural forms as well, unless the context clearly dictates otherwise. It should be further understood that when terms "consist of" and/or "comprise/include" used in the specification mean that the stated features, integers, steps, operations, elements and/or parts are present, but the presence or addition of one or more of other features, integers, steps, operations, elements, parts and/or combinations is not excluded. When used herein, the term "and/or" includes any of the listed items and all combinations thereof.

Figure 1:
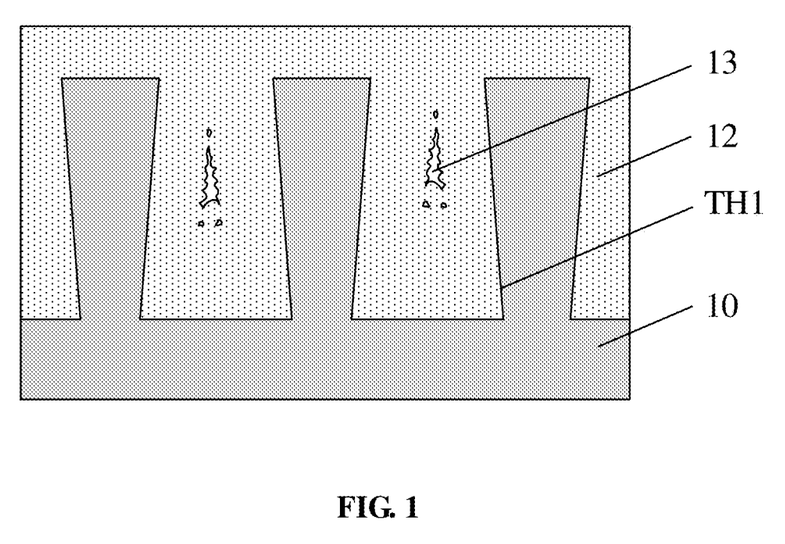
FIG. 1 is a schematic diagram of an exemplary semiconductor structure.

In a semiconductor device, such as DRAM, the quality of conductive lines will affect the electrical performance of the resulting devices. FIG. 1 is a schematic diagram of an exemplary semiconductor structure. As shown in FIG. 1, the semiconductor device includes a substrate 10. The substrate 10 is provided with a plurality of trenches TH1 filled with a polysilicon layer 12.

The polysilicon layer 12 is formed in the trenches TH1 by a conventional deposition process. It can be seen that there are voids 13 inside the polysilicon layer 12, and the existence of the voids 13 will increase the resistance of the polysilicon layer and then affect the electrical performance of the conductive lines formed later.

On the basis of this, the following technical solution of the embodiments of the disclosure is proposed.

Figure 2:
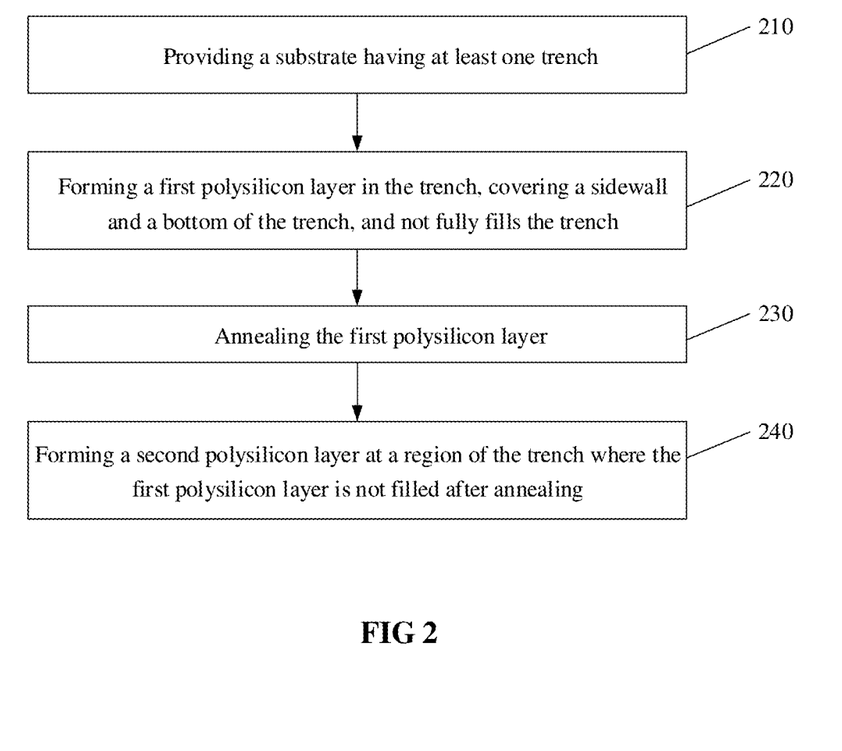
FIG. 2 is a flowchart of a method for manufacturing a semiconductor device in an embodiment of the disclosure.

The embodiments of the disclosure provide a method for manufacturing a semiconductor device, as shown in FIG. 2. The method includes the following operations.

In S210: a substrate having at least one trench is provided.

In S220: a first polysilicon layer is formed in the trench, which covers a sidewall and a bottom of the trench but not fully fills the trench.

In S230: the first polysilicon layer is annealed.

In S240: a second polysilicon layer is formed at a region of the trench where the first polysilicon layer is not filled after annealing.

In the embodiments of the disclosure, after the first polysilicon layer is formed in the trench, the annealing process is performed which significantly reduces lattice defects of the first polysilicon layer, and flattens the first polysilicon layer and improve the filling ability of the second polysilicon layer. Therefore, the embodiments of the present disclosure can effectively reduce or even eliminate the voids in the first and the second polysilicon layer finally filled in the trench, thereby improving the electrical performance of the semiconductor device.

In order to make the above objects, features and advantages of the disclosure more apparent and understandable, specific embodiments of the disclosure will be described in detail below with reference to the drawings. In detailing the embodiments of the disclosure, the schematic diagrams may be partially enlarged without in accordance with a general scale for convenience in description, and the schematic diagrams are only provided as examples, and not intend to limit the protection scope of the disclosure herein.

FIGS. 3 to 8 are diagrams showing the process flow of a method for manufacturing a semiconductor device in an embodiment of the disclosure.

Figure 3:
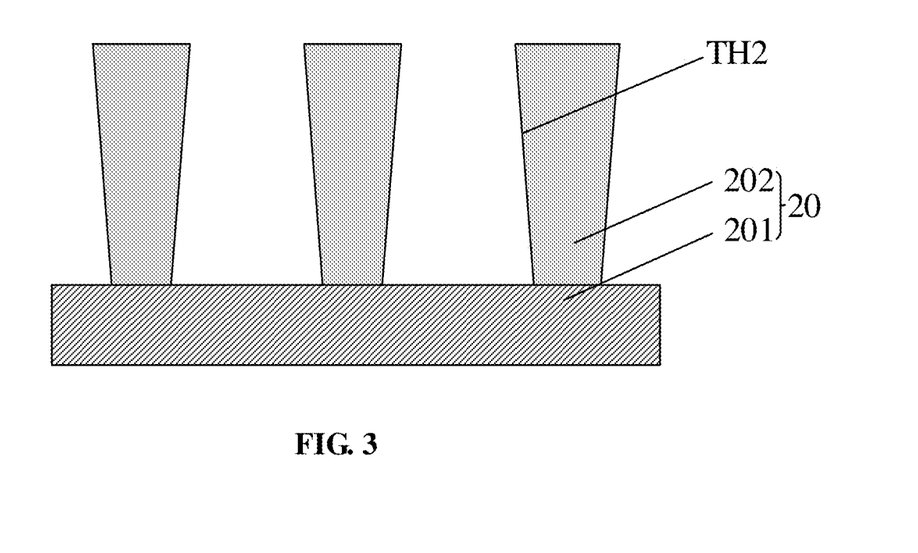
FIGS. 3 to 8 are diagrams showing the process flow a method for manufacturing a semiconductor device in an embodiment of the disclosure.

Firstly, as shown in FIG. 3, performing S210, a substrate 20 having at least one trench TH2 is provided.

The trench TH2 may be formed in the substrate 20 by dry etching or wet etching.

In some specific embodiments, the substrate 20 includes a base 201 and a plurality of discrete device layers 202 formed on the base 201, and a trench TH2 is formed between two adjacent ones of the device layers 202. Specifically, the base 201 may be a semiconductor material such as silicon. The device layers 202 may be formed of a single layer of material or multiple layers of material(s). The device layers 202 may include a conductive layer or an insulating layer. The device layers 202 may be retained in the final semiconductor device or may be removed during the manufacturing of the semiconductor device. In a word, embodiments of the disclosure do not limit a material, number of layers and use of the device layers 202.

Figure 4:
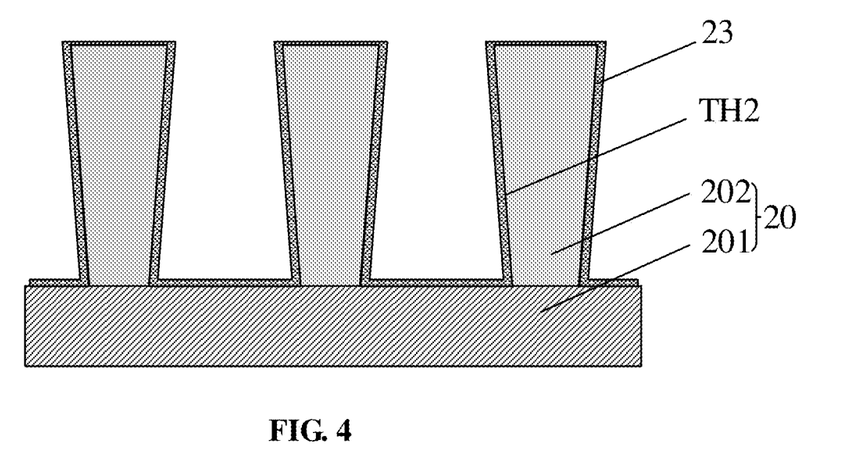

According to some embodiments, as shown in FIG. 4, before the first polysilicon layer 21 is formed in the trench TH2 (referring to FIG. 6), the method further includes: depositing an insulating layer 23 on the sidewall of the trench TH2. The insulating layer 23 serves to isolate the device layers 202 and the first polysilicon layer 21. The material of an insulating layer 23 may include but is not limited to oxide, nitride and nitrogen oxide, such as silicon oxide, silicon nitride, silicon oxynitride and the like.

Figure 5:
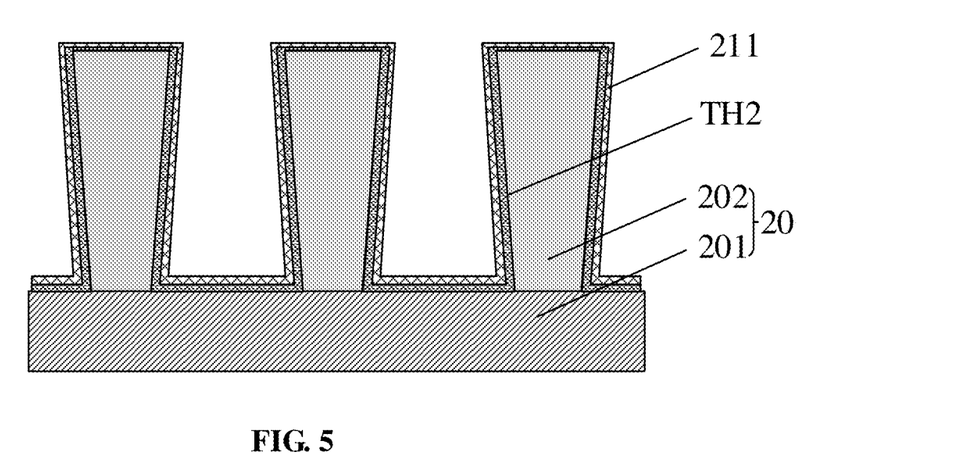
Figure 6:
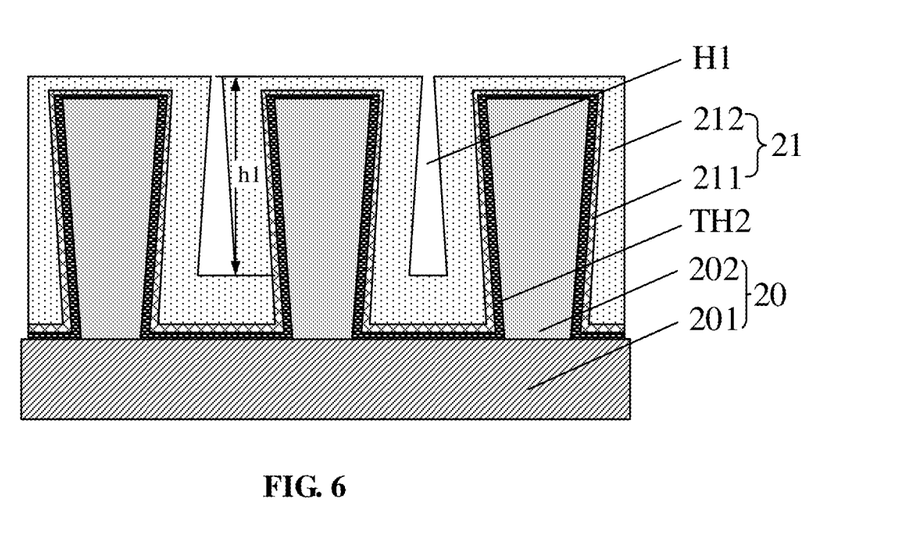

Subsequently, as shown in FIGS. 5 and 6, performing S220, a first polysilicon layer 21 is formed in the trench TH2, which covers the sidewall and the bottom of the trench TH2 but not fully fills the trench TH2.

According to some embodiments, the first polysilicon layer 21 may include a first sub-layer 211 and a second sub-layer 212. Forming the first polysilicon layer 21 in the trench TH2 includes the following operations.

A first sub-layer 211 is formed in the trench TH2, which covers the sidewall and the bottom of the trench TH2, as shown in FIG. 5.

A second sub-layer 212 is formed on the first sub-layer 211, as shown in FIG. 6.

The first sub-layer 211 and the second sub-layer 212 have the same material and are both polysilicon layers. The first sub-layer 211 is a seed layer, and the first sub-layer 211 forms a plurality of "core centers" on the sidewall and the bottom of the trench TH2. With the so-called "core centers", abnormal crystalline grain growth in the subsequent deposition of the second sub-layer 212 can be avoided, thereby reducing lattice mismatch between the second sub-layer 212 and the trench TH2, and improving the uniformity and growth quality of the second sub-layer 212.

The first polysilicon layer 21 may be a doped polysilicon layer, for example, may be at least one of boron-doped polysilicon, phosphorus-doped polysilicon, or arsenic-doped polysilicon.

The first polysilicon layer 21 may be formed by one or more of thin film deposition processes. Specifically, the thin film deposition processes include, but are not limited to, chemical vapor deposition (CVD), plasma enhanced chemical vapor deposition (PECVD), atomic layer deposition (ALD), or a combination thereof.

In an exemplary embodiment, the first polysilicon layer 21 is formed by low pressure chemical vapor deposition (LPCVD). Specifically, the deposition temperature of the first polysilicon layer 21 is in a range from 350° C. to 700° C., and the deposition pressure is from 0.2 Torr to 4 Torr. The gas used to form the first polysilicon layer 21 may include, but is not limited to, silane ($SiH_4$), disilane ($Si_2H_6$), dichlorosilane ($SiH_2Cl_2$), etc. In an actual process, two or more gases selected from silane ($SiH_4$), disilane ($Si_2H_6$), dichlorosilane ($SiH_2Cl_2$) may be mixed for use or used alternately. When the first polysilicon layer 21 is a doped polysilicon layer, one or more of gases selected from phosphine ($PH_3$), boron trichloride ($BCl_3$), borane ($B_2H_6$), arsenic alkane ($AsH_4$) are introduced into a chamber during preparation to form the doped polysilicon layer.

In an actual process, the ratio of the thickness of the first polysilicon layer 21 to the depth of the trench TH2 is in a range from 1:5 to 1:4. If the first polysilicon layer 21 is too thick or too thin, the second polysilicon layer 22 grown subsequently will be adversely affected.

Continuously referring to FIG. 6, the region of the trench TH2 where the first polysilicon layer 21 is not filled constitutes a first opening H1 before the first polysilicon layer 21 is annealed, and the depth of the first opening H1 is denoted as h1. The first opening H1 has a cross-sectional shape of a narrow top and a wide bottom. It should be understood that the first opening H1 having a cross-sectional shape with a narrow top and a wide bottom is not conducive to the subsequent deposition of the second polysilicon layer 22 (referring to FIG. 8).

Figure 7:
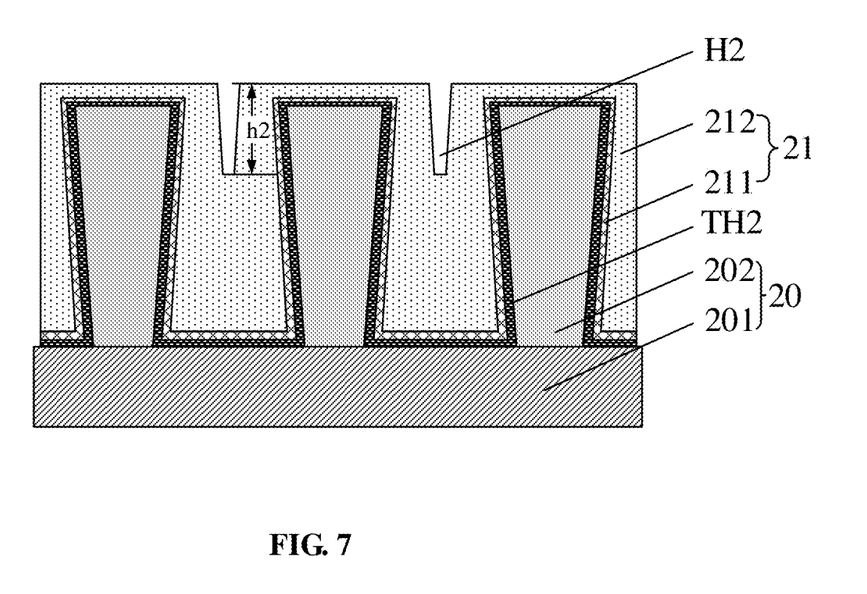

Next, as shown in FIG. 7, performing S230, the first polysilicon layer 21 is annealed. The annealing process can purge semi-reactants or impurities in the first polysilicon layer 21, significantly reducing lattice defects of the first polysilicon layer 21, and at the same time make the first polysilicon layer 21 more flat, which is beneficial to the subsequent deposition of the second polysilicon layer 22 (referring to FIG. 8). Here, the semi-reactants or impurities include but are not limited to hydrogen, hydrogen chloride and the like.

After annealing, referring to FIG. 7, the region of the trench TH2 where the first polysilicon layer 21 is not filled constitutes a second opening H2, and the depth of the second opening H2 is denoted as h2. The second opening H2 has a cross-sectional shape of a wide top and a narrow bottom. It can be seen according to FIG. 6 that, the depth h2 of the second opening H2 is less than the depth h1 of the first opening H1, that is h2<h1. In other words, after annealing, the depth of the opening above the first polysilicon layer 21 becomes shallow, and the cross-sectional shape of the opening with a narrow top and a wide bottom changes to a wide top and a narrow bottom, which is more favorable for subsequent filling of the second polysilicon layer 22.

The annealing process is carried out in an annealing furnace. Specifically, the annealing furnace may be a furnace tube. In an embodiment of the disclosure, the annealing temperature is in a range from 500° C. to 700° C., the annealing pressure is in a range from 10 Torr to 100 Torr, and the annealing lasts for a range from 1 h to 2 h. Optionally, nitrogen is introduced into the annealing furnace during annealing. Here, nitrogen serves to stabilize the pressure in the process chamber so that the annealing process can be carried out in the set pressure range.

Figure 8:
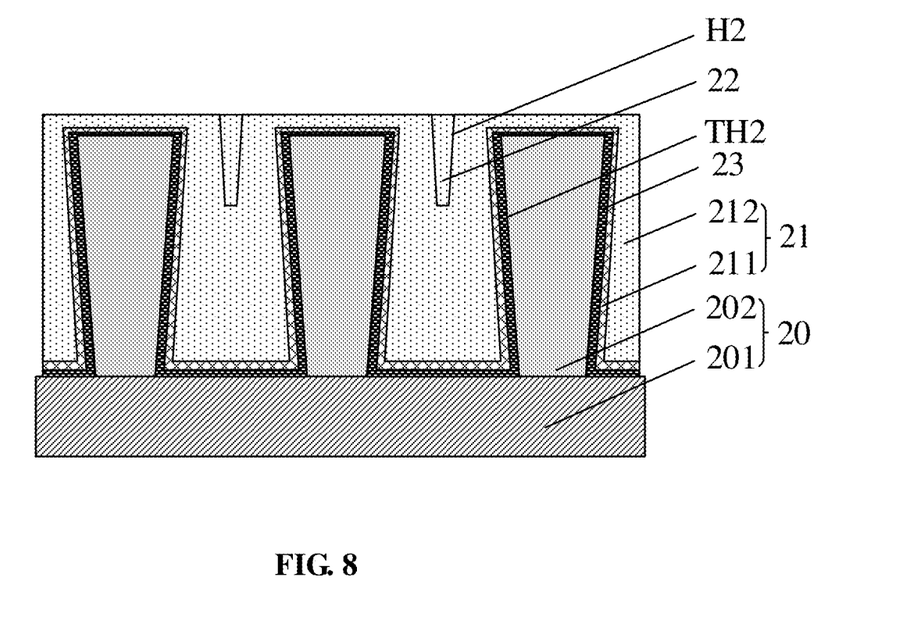

Finally, as shown in FIG. 8, performing S240, the second polysilicon layer 22 is formed at the region of the trench TH2 where the first polysilicon layer 21 is not filled after annealing. That is, the second polysilicon layer 22 is formed in the second opening H2.

At this point, the trench TH2 is filled up with the first polysilicon layer 21 and the second polysilicon layer 22, and the porosity of the first polysilicon layer 21 and the second polysilicon layer 22 is much less than the porosity of a polysilicon layer 12 in the related art.

The second polysilicon layer 22 may be a doped polysilicon layer, for example, may be at least one of boron-doped polysilicon, phosphorus-doped polysilicon, or arsenic-doped polysilicon. The doping elements in the second polysilicon layer 22 and the doping elements in the first polysilicon layer 21 may be the same or different.

The second polysilicon layer 22 may be formed by one or more of thin film deposition processes. Specifically, the thin film deposition processes include, but are not limited to, chemical vapor deposition (CVD), plasma enhanced chemical vapor deposition (PECVD), atomic layer deposition (ALD), or a combination thereof.

In a specific embodiment, the second polysilicon layer 22 is formed by low pressure chemical vapor deposition (LPCVD). Specifically, the deposition temperature of the second polysilicon layer 22 is in a range from 350° C. to 700° C., and the deposition pressure is from 0.2 Torr to 4 Torr. The gas used to form the second polysilicon layer 22 may include, but is not limited to, silane ($SiH_4$), disilane ($Si_2H_6$), dichlorosilane ($SiH_2Cl_2$), etc. In an actual process, two or more gases selected from silane ($SiH_4$), disilane ($Si_2H_6$), dichlorosilane ($SiH_2Cl_2$) may be mixed for use or used alternately. When the second polysilicon layer 22 is a doped polysilicon layer, one or more of gases selected from phosphine ($PH_3$), boron trichloride ($BCl_3$), borane ($B_2H_6$), arsenic alkane ($AsH_4$) is introduced into the chamber during preparation to form the doped polysilicon layer.

In an embodiment of the disclosure, the operation of forming the first polysilicon layer 21, the operation of annealing and the operation of forming the second polysilicon layer 22 are completed in the same process. In this way, oxidization of the surface of the first polysilicon layer 21 to form an oxide layer, which may occur otherwise during transportation between different processes and thus increase the resistance of the first polysilicon layer 21 and the second polysilicon layer 22, can be avoided.

Specifically, an apparatus for implementing the same process includes, but is not limited to a furnace tube. That is, the following operations can be successively performed in a furnace tube: forming the first polysilicon layer, performing annealing process and forming the second polysilicon layer. During this process, the substrate on which the first polysilicon layer is formed does not need to be taken out from the furnace tube, and the first polysilicon layer will not be oxidized.

In an embodiment, after the second polysilicon layer is formed, the method further includes: annealing the second polysilicon layer. The main purpose of the annealing process is to repair defects of the second polysilicon layer, and the annealing process further reduces the porosity in the second polysilicon layer, and improves the quality of the film of the second polysilicon layer.

The conditions for annealing the second polysilicon layer may be the same as or different from those for annealing the first polysilicon layer, and will not be repeated here.

In the embodiments of the disclosure, the first polysilicon layer and the second polysilicon layer may constitute conductive lines, such as bit lines, word lines and the like in a DRAM device, but are not limited to this, and may also constitute other conductive structures, for example, conductive plugs such as bit line plugs in a DRAM device.

In the method for manufacturing a semiconductor device provided by embodiments of the disclosure, after the first polysilicon layer is formed in the trench, an annealing process is performed, and then a second polysilicon layer is deposited on the first polysilicon layer. Using the above method for forming the polysilicon layer filled in the trench, the porosity of the polysilicon layer can be significantly reduced, and the quality of the film of the polysilicon layer can be improved, thereby improving the electrical performance of the polysilicon layer.

Further, in an embodiment of the disclosure, the operation of forming the first polysilicon layer 21, the operation of annealing and the operation of forming the second polysilicon layer 22 are implemented in a same process. Little or no oxide layer is allowed to be generated between the first polysilicon layer 21 and the second polysilicon layer 22 finally formed in the trench, which is conducive to reducing the resistance of the polysilicon layer finally formed, so that a semiconductor device with good electrical performances is formed.

Embodiments of the present disclosure also provide a semiconductor device, as shown in FIG. 8. The semiconductor device includes: a substrate 20 having at least one trench TH2 therein; a first polysilicon layer 21 covering a sidewall and a bottom of the trench TH2, in which a second opening H2 is provided above the first polysilicon layer 21; a second polysilicon layer 22 formed in the second opening H2, in which the second opening H2 has a cross-sectional shape of a wide top and a narrow bottom. The second opening H2 has a cross-sectional shape of a wide top and a narrow bottom is because the first polysilicon layer 21 is grown in a manner of covering the sidewall and the bottom surface of the trench TH2, and the first polysilicon layer 21 is annealed after being formed.

In some embodiments, the substrate 20 includes a base 201 and a plurality of discrete device layers 202 formed on the base, and the trench TH2 is formed between two adjacent ones of the device layers 202. Specifically, the base 201 may be a semiconductor material such as silicon. The device layers 202 may be formed of a single layer of material or multiple layers of material(s). The device layers 202 may include a conductive layer or an insulating layer. The device layers 202 may be retained in the final semiconductor device or may be removed during the manufacturing of the semiconductor device. In a word, embodiments of the disclosure do not limit material(s), number of layers and use(s) of the device layers 202.

In some embodiments, an insulating layer 23 is further provided between the sidewall of the trench TH2 and the first polysilicon layer 21. The insulating layer 23 serves to isolate the device layers 202 and the first polysilicon layer 21. A material of the insulating layers 23 may include but is not limited to silicon oxide, silicon nitride, silicon carbide, silicon oxynitride or the like.

Optionally, the first polysilicon layer 21 may include a first sub-layer 211 and a second sub-layer 212, and the first sub-layer 211 is a seed layer of the second sub-layer 212. Here, the first sub-layer 211 is the seed layer, and the first sub-layer 211 forms a plurality of "core centers" on the sidewall and the bottom of the trench TH2. With the so-called "core centers", abnormal crystalline grain growth in the subsequent deposited second sub-layer 212 can be avoided, thereby reducing lattice mismatch between the second sub-layer 212 and the trench TH2, and improving the uniformity and growth quality of the second sub-layer 212.

The first polysilicon layer 21 and/or the second polysilicon layer 22 may be a doped polysilicon layer. For example, the doped polysilicon layer may be at least one of boron-doped polysilicon, phosphorus-doped polysilicon, or arsenic-doped polysilicon.

The first polysilicon layer 21 and/or the second polysilicon layer 22 may be formed by one or more of thin film deposition processes. Specifically, the thin film deposition processes include, but are not limited to, chemical vapor deposition (CVD), plasma enhanced chemical vapor deposition (PECVD), atomic layer deposition (ALD), or a combination thereof.

In a specific embodiment, the first polysilicon layer 21 and/or the second polysilicon layer 22 is formed by low pressure chemical vapor deposition (LPCVD). Specifically, the deposition temperature of the first polysilicon layer 21 and/or the second polysilicon layer 22 is in a range from 350° C. to 700° C., and the deposition pressure is from 0.2 Torr to 4 Torr. The gas used to form the first polysilicon layer 21 and/or the second polysilicon layer 22 may include, but is not limited to, silane ($SiH_4$), disilane ($Si_2H_6$), dichlorosilane ($SiH_2Cl_2$), etc. In an actual process, two or more gases selected from silane ($SiH_4$), disilane ($Si_2H_6$), dichlorosilane ($SiH_2Cl_2$) can be mixed for use or used alternately. When the first polysilicon layer 21 and/or the second polysilicon layer 22 is a doped polysilicon layer, one or more of gases selected from phosphine ($PH_3$), boron trichloride ($BCl_3$), borane ($B_2H_6$), arsenic alkane ($AsH_4$) is introduced into a chamber during preparation to form the doped polysilicon layer.

It could be understood that annealing the first polysilicon layer can significantly reduce lattice defects of the first polysilicon layer, and improve the planarization of the first polysilicon layer 21, which is conducive to improving the filling ability of the second polysilicon layer formed later and greatly reduce the possibility of generating voids in the polysilicon layer. In addition, during annealing, the annealing process can purge semi-reactants or impurities generated during the formation of the first polysilicon layer 21 out of the first polysilicon layer 21, so as to improve the quality of the film of the formed first polysilicon layer 21.

The annealing process is carried out in an annealing furnace. Specifically, the annealing furnace can be a furnace tube. In an embodiment of the disclosure, the annealing temperature is in a range from 500° C. to 700° C., the annealing pressure is in a range from 10 Torr to 100 Torr, and the duration is in a range from 1 h to 2 h. Optionally, nitrogen is introduced into the annealing furnace during annealing. Here, nitrogen serves to stabilize the pressure in the process chamber so that the annealing process can be carried out in the set pressure range.

In the embodiments of the disclosure, the first polysilicon layer and the second polysilicon layer may constitute conductive lines, such as bit lines, word lines and the like in a DRAM device, but are not limited thereto, and may also constitute other conductive structures, for example, conductive plugs such as bit line plugs in a DRAM device.

In the semiconductor device of the embodiment of the disclosure, almost no void exists in the formed polysilicon layer, which reduces the resistance of the polysilicon layer filled in the trench TH2 and is conducive to forming a semiconductor device having good electrical quality. It should be understood that the semiconductor device may be formed by a method for manufacturing the semiconductor device provided by the above embodiments.

It should be noted that the method for manufacturing the semiconductor device provided by the embodiment of the disclosure may be applied to a DRAM structure or other semiconductor devices without too much limitation herein. The embodiments of the method for manufacturing a semiconductor device and the embodiments of the semiconductor device in the disclosure belong to the same concept. Any technical feature(s) of the technical solution described in each embodiment can be arbitrarily combined with each other if there is no conflict.

The description above is only preferred embodiments of the disclosure, and is not intended to limit the protection scope of the present disclosure. Any modification, equivalent replacement or improvement made within the spirit and principle of the disclosure falls within the protection scope of the disclosure.

INDUSTRIAL PRACTICALITY

The embodiments of the disclosure provide a method for manufacturing a semiconductor device and the same. The method includes: providing a substrate having at least one trench; forming a first polysilicon layer in the trench which covers a sidewall and a bottom of the trench but not fully fills the trench; annealing the first polysilicon layer; and forming a second polysilicon layer at a region of the trench where the first polysilicon layer is not filled after annealing. After the first polysilicon layer is formed in the trench, an annealing process is performed which significantly reduces lattice defects of the first polysilicon layer, and flattens the first polysilicon layer and improves the filling ability of the second polysilicon layer. Therefore, the embodiments of the disclosure can effectively reduce or even eliminate the voids in the first polysilicon layer and the second polysilicon layer finally filled in the trench, thereby improving the electrical performance of the semiconductor device.

The invention claimed is:

1. A method for manufacturing a semiconductor device, comprising:
   providing a substrate having at least one trench;
   forming a first polysilicon layer in the trench, covering a sidewall and a bottom of the trench, and not fully fills the trench;
   annealing the first polysilicon layer; and
   forming a second polysilicon layer at a region of the trench where the first polysilicon layer is not filled after annealing;
   wherein
   forming the first polysilicon layer, annealing and forming the second polysilicon layer are completed in a same process.

2. The method of claim 1, wherein
   a ratio of a thickness of the first polysilicon layer to a depth of the trench before annealing is in a range from 1:5 to 1:4.

3. The method of claim 1, wherein
   the region of the trench where the first polysilicon layer is not filled constitutes a first opening before annealing the first polysilicon layer, and the first opening has a cross-sectional shape of a narrow top and a wide bottom.

4. The method of claim 3, wherein,
   a region of the trench where the first polysilicon layer is not filled constitutes a second opening after annealing the first polysilicon layer, and the second opening has a cross-sectional shape of a wide top and a narrow bottom.

5. The method of claim 4, wherein
   a depth of the second opening is less than a depth of the first opening.

6. The method of claim 1, wherein
   an annealing temperature is in a range from 500° C. to 700° C., an annealing pressure is in a range from 10 Torr to 100 Torr, and an annealing time is in a range from 1 h to 2 h.

7. The method of claim 1, wherein
   an apparatus for completing the same process comprises a furnace tube.

8. The method of claim 1, wherein
   at least one of the first polysilicon layer or the second polysilicon layer comprises a doped polysilicon.

9. The method of claim 8, wherein
   the doped polysilicon comprises at least one of boron-doped polysilicon, phosphorus-doped polysilicon or arsenic-doped polysilicon.

10. The method of claim 1, further comprising:
    depositing an insulating layer on the sidewall of the trench before the first polysilicon layer is formed in the trench.

11. The method of claim 1, wherein
    the first polysilicon layer comprises a first sub-layer and a second sub-layer, and forming the first polysilicon layer in the trench comprises:
    forming a first sub-layer in the trench, covering the sidewall and the bottom of the trench; and
    forming a second sub-layer on the first sub-layer.

12. The method of claim 1, wherein
    a deposition temperature of at least one of the first polysilicon layer or the second polysilicon layer is in a range from 350° C. to 700° C., and a deposition pressure is from 0.2 Torr to 4 Torr.

13. The method of claim 1, further comprising:
    annealing the second polysilicon layer after the second polysilicon layer is formed.

* * * * *